United States Patent [19]

Sakaguchi et al.

[11] Patent Number: 4,534,821
[45] Date of Patent: Aug. 13, 1985

[54] SINGLE CRYSTAL GROWING OF RARE EARTH-GALLIUM GARNET

[75] Inventors: Susumu Sakaguchi; Ken Itoh; Masahiro Ogihara; Shinji Makigawa; Toshihiko Ryuo; Kazuyoshi Watanabe, all of Gunma, Japan

[73] Assignee: Shin-Etsu Chemical Co., Ltd., Tokyo, Japan

[21] Appl. No.: 503,837

[22] Filed: Jun. 13, 1983

[30] Foreign Application Priority Data

Nov. 8, 1982 [JP] Japan .................................. 57-195703

[51] Int. Cl.³ ............................................. C30B 15/14
[52] U.S. Cl. ...................... 156/617 SP; 156/DIG. 63; 156/DIG. 89
[58] Field of Search ................ 156/617 SP, DIG. 63, 156/DIG. 70, DIG. 83, DIG. 89, DIG. 64

[56] References Cited

U.S. PATENT DOCUMENTS 3,723,599  3/1973  Brandle et al. ............. 156/DIG. 63
4,233,270  11/1980  Schmidt .................. 156/DIG. 83 X
4,400,232  8/1983  Ownby et al. ........... 156/DIG. 89 X Primary Examiner—Hiram H. Bernstein
Assistant Examiner—Michael S. Gzybowski

[57] ABSTRACT

An improvement in the Czochralski single crystal growing of a rare earth-gallium garnet such as gadolinium gallium garnet according to which the single crystal boules of a relatively large diameter and outstandingly free from any crystal defects and inclusions are readily obtained. The improved method comprises keeping the melt of the oxide mixture formed in an iridium crucible for at least 15 hours in the molten state before crystal growing is started. It was also shown that addition of certain additive gases, e.g. water vapor, carbon dioxide and oxygen, to the gaseous atmosphere mainly composed of, for example, nitrogen, in which crystal growing was performed, in a limited proportion was effective to further improve the crystal quality and to decrease the particulate inclusions in the single crystal boules.

4 Claims, 4 Drawing Figures

SINGLE CRYSTAL GROWING OF RARE EARTH-GALLIUM GARNET

BACKGROUND OF THE INVENTION

The present invention relates to an improvement in the single crystal growing of a rare earth-gallium garnet by the so-called Czochralski method in the preparation of a single crystal boule having a relatively large, e.g. 50 mm or larger, diameter and outstandingly free from crystal defects.

As is well known, single crystals of a rare earth-gallium garnet having a composition expressed by the formula $R_3Ga_5O_{12}$, in which R is a rare earth element such as gadolinium, samarium, neodymium and the like, are useful materials in the technology of electronics, for example, as a substrate of the magnetic bubble domain memory. It is very important that the substrate for the magnetic bubble domain memory should be as free as possible from any crystal defects since the defects in the substrate crystal necessarily result in the defect in the epitaxial surface film of the rare earth-iron garnet formed on the surface of the substrate by the method of the liquid phase epitaxial growing.

Single crystal boules of the rare earth-gallium garnet are usually prepared by the method of so-called Czochralski crystal growing in which a mixture of gallium oxide and the rare earth oxide, e.g. gadolinium oxide, samarium oxide, neodymium oxide and the like, is melted in a crucible made of a refractory metal such as iridium and a seed crystal of the garnet is contacted to the surface of the melt and then pulled up gradually with simultaneous rotation around the vertical axis so that the single crystal grows from the melt on the lower end of the seed crystal.

It is known that, in the above described process of the single crystal growing by the Czochralski method, dislocations and lattice distortion are produced in the single crystal boule by the presence of fine particles of the lower oxide formed by the decomposition of part of the starting oxides and the iridium metal formed from the crucible in the melt at the extremely high temperature for crystal growing which unavoidably are taken up into the single crystal grown from the melt as inclusions. When such a defective single crystal boule is used as the base material for the substrates, the yield of acceptable products of the magnetic bubble domain memory is naturally decreased.

Needless to say, various attempts have been made to decrease the crystal defects in the single crystal boules of the rare earth-gallium garnets including a method in which the melt of the oxide mixture is kept for a length of time of 1 to 10 hours under an atmosphere of which the partial pressure of oxygen is from 3.8 to 19.4 mmHg before the melt is seeded with a seed crystal (see, for example, U.S. Pat. No. 3,723,599), a method in which pulling-up of a single crystal by the Czochralski method is performed under an ozone-containing atmosphere formed by the ozonization treatment of a gas containing from 0.25 to 1.5% by volume of oxygen (see, for example, Japanese Patent Publication No. 54-1278), a method in which the Czochralski single crystal growing is performed under an atmosphere of nitrogen gas containing 0.5 to 3% by volume of oxygen (see, for example, Japanese Patent Kokai No. 55-136200) and a method in which the iridium crucible is first heated in an atmosphere containing at least 1% by volume of oxygen to oxidize the surface followed by dissipation and removal of the surface oxide of iridium by heating at 1500° C. or higher in an inert atmosphere (see, for example, Japanese Patent Publication No. 51-35600).

These prior art methods are, however, far from sufficient to afford a complete solution to the above mentioned problems since the crystal growing in each of these methods is performed under an atmosphere containing oxygen or oxidizing gas so that the oxidation of iridium as the material of the crucible cannot be completely prevented. Moreover, the amounts of the undesirable inclusion in the oxide melt in these prior art methods are susceptible even to a very slight change in the conditions such as the composition of the starting oxide mixture, composition of the atmospheric gas, structure of the heat-insulating muffles and the like. This problem is more and more serious as the diameter of the single crystal boule is increased in compliance with to the recent trend of the technology requiring single crystal boules of larger and larger diameter in order to improve the efficiency for the preparation of the substrates for the magnetic bubble domain memories.

SUMMARY OF THE INVENTION

An object of the present invention is to provide an improvement in the single crystal growing process of a rare earth-gallium garnet by the Czochralski method according to which even an outstandingly defect-free single crystal boule of the rare earth-gallium garnet having a diameter of 50 mm or larger can readily and reproducibly be obtained.

The improvement provided by the present invention comprises, in the preparation of a single crystal boule of a rare earth-gallium garnet having a diameter of at least 50 mm by the Czochralski crystal growing method using an iridium crucible having an inner diameter of at least 80 mm, keeping the uniform melt formed by heating the oxide mixture in the crucible for at least 15 hours in the molten state before the melt is seeded with a seed crystal to start crystal growing.

As is shown later by the examples, the composition of the atmospheric gas, in which the oxide mixture is melted and crystal growing is performed, is also of some significance to the defect-free crystal growing of the garnet.

DETAILED DESCRIPTION OF THE PREFERRED EMBODIMENTS

Figure 1:
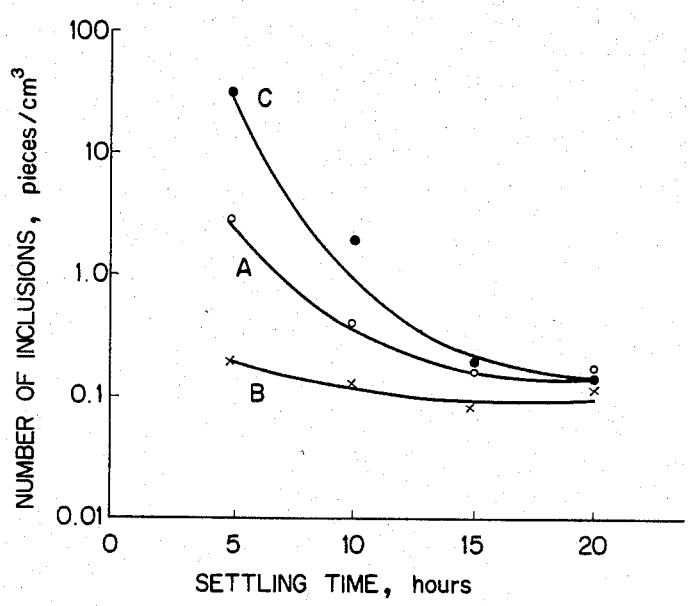
FIG. 1 is a graph showing the relationship between the length of the settling time of the oxide melt kept in a crucible and the number of inclusions in the single crystal boule for three series of experiments by use of iridium crucibles of different dimensions.

As is described above, the principle of the improvement provided by the invention is relatively simple as established as a result of the extensive investigations undertaken by the inventors with an object to control the amount of the undesirable inclusions such as iridium taken up into the single crystal boule of a rare earth-gallium garnet grown by the Czochralski method. The investigations undertaken by the inventors have arrived at a discovery that, while fine particles of iridium and the lower oxides formed from the starting oxides are more or less contained in the oxide melt when the starting mixture composed of the rare earth oxide and gallium oxide is melted in an iridium crucible, growing of such fine particles takes place when the oxide melt is kept in the molten state for a length of time so that settling of the thus grown particles in the melt is accelerated to be eventually deposited on the bottom of the crucible. The improvement obtained by utilizing the above phenomenon is more remarkable by extending the time for keeping the oxide melt in the molten state to at least 15 hours, in particular, when the diameter of the iridium crucible is 80 mm or larger to be suitable for growing a single crystal boule of the garnet having a diameter of 50 mm or larger. The present invention has been completed on the base of this unexpected discovery.

The method of the Czochralski single crystal growing of the rare earth-gallium garnet per se is rather conventional. That is, gallium oxide $Ga_2O_3$ and a rare earth oxide $R_2O_3$, in which R is a rare earth element, e.g. gadolinium, samarium or neodymium, after complete removal of any volatile matter such as moisture are taken and blended in an approximately stoichiometric proportion for the rare earth-gallium garnet $R_3Ga_5O_{12}$ and the mixture is sintered by heating at 1200° to 1500° C. into blocks which are melted in an iridium crucible, usually, by high frequency induction heating. The seed crystal vertically held on the lower end of a rotatable shaft is gradually lowered to contact with the surface of the oxide melt in the crucible and then gradually pulled up with simultaneous rotation around the vertical axis so that the desired single crystal grows on the seed as it is pulled up.

In the method of the present invention, the melt of the oxide mixture in the crucible is maintained for at least 15 hours in the molten state before crystal growing by the upward pulling of a seed crystal is started. It is preferable that, when the oxide mixture in the crucible has been melted, the seed crystal is once brought into contact with the surface of the oxide melt and the high frequency power input is controlled at a level suitable for crystal growing followed by pulling the seed up apart from the oxide melt and the oxide melt is kept at the molten state with the seed crystal held apart thereabove. During the interval of at least 15 hours to keep the oxide melt at the molten state, growth of the particulate inclusions in the melt takes place and the thus grown particles settle in the melt down to the bottom of the crucible to leave an inclusion-free oxide melt at least in the upper layer of the melt. It is presumable that the single crystal boule of the rare earth-gallium garnet is also quite free from any inclusions and crystal defects when it has been grown from such an inclusion-free oxide melt by starting the crystal growing only after settling of the particulate inclusions in the melt.

As is mentioned before, the inventors have found certain significance in the composition of the gaseous atmosphere in which the oxide mixture is melted and kept for at least 15 hours in the molten state and the crystal growing is performed by seeding and pulling up. Needless to say, the gaseous atmosphere is mainly composed of an inert gas such as nitrogen, argon, helium and the like but addition of a small volume of other kinds of gases such as water vapor, carbon dioxide, hydrogen or oxygen to the atmosphere may influence the quality of the single crystal boule grown in the atmosphere. In particular, addition of water vapor, carbon dioxide or oxygen to the atmosphere in limited proportions is effective to obtain high quality single crystal boules with reproducibility.

When the additive gas is water vapor, the atmospheric gas should be admixed with at least 0.1% by volume of water vapor so that the amount of inclusion in the single crystal boule can be effectively reduced. On the other hand, the amount of water vapor in the atmospheric gas should not exceed 4.0% by volume due to eventual dew formation on the cool surfaces such as the walls of the furnace chamber and the water-cooled work coil for high frequency induction leading to the increase in the danger of electric discharge and leakage. Thus, the amount of water vapor in the atmospheric gas is preferably in the range from 0.1 to 4.0% by volume.

The addition of carbon dioxide to the atmospheric gas is effective to suppress the decomposition and dissipation of gallium oxide in the oxide melt so that accordingly the amount of the inclusions of the lower oxide thereof can be decreased. Such a beneficial effect is obtained when the atmospheric gas contains from 10 to 20% by volume of carbon dioxide gas. When the amount of carbon dioxide is smaller than above, no sufficient effect of improvement can of course be obtained while an excessively large amount of carbon dioxide rather increases the iridium inclusion in the single crystal boule grown in such an atmosphere.

When the additive gas to the inert atmosphere is oxygen, decomposition and dissipation of the starting oxides can be suppressed so that the amount of inclusions in the single crystal boules is also effectively decreased. The amount of oxygen gas in the atmosphere should preferably be in the range from 0.3 to 1.5% by volume since no sufficient improvement can be obtained with a smaller volume of oxygen addition than above while an excessively large amount of oxygen in the atmosphere is undesirable because of the eventual formation of a scum-like material floating on the surface of the melt and adhering to the periphery of the single crystal under growing to serve as the starting points of the crystal defects.

In the following, the method of the present invention is described in further detail by way of examples. In the following examples, the number of particles as the inclusion in the single crystal boule was given as an average of the numbers obtained by counting by the aid of a microscope in several wafer-like plates of the single crystal of 0.5 mm thickness prepared by slicing the boule perpendicularly to the longitudinal axis of the boule, i.e. the direction of single crystal pulling-up, followed by mirror-polishing.

EXAMPLE 1.

Gadolinium oxide and gallium oxide each having a nominal purity of 99.995% were calcined at 1200° C. for 8 hours and 2148.4 g of the former and 1851.6 g of the latter were taken and uniformly blended. The mixing ratio corresponded to the stoichiometric composition for the gadolinium gallium garnet $Gd_3Ga_5O_{12}$. The oxide mixture was shaped and sintered at 1450° C. for 5 hours into sintered blocks.

The thus obtained sintered blocks were put into an iridium crucible having an inner diameter of 96 mm and a depth of 98 mm and melted therein by heating up to about 1750° C. with high frequency induction. The atmospheric gas inside the furnace chamber was nitrogen containing 0.6% by volume of water vapor to give a dew point of 0° C. formed by suitably mixing a pure nitrogen gas of at least 99.997% purity with a dew point of −70° C. or below and a nitrogen gas moistened by bubbling through water thermostated at 50°±2° C. The flow rate of the nitrogen gas containing the thus controlled moisture was 5 liters/minute.

When the oxide mixture in the crucible had come to complete melting, the tip of a seed crystal of gadolinium gallium garnet having a crystal orientation of <111> and held on the lower end of a vertically rotatable shaft was contacted to the surface of the oxide melt and the high frequency power input was controlled to a level suitable for starting the crystal growing on the seed. Thereafter, the seed crystal was pulled up to be separated from the oxide melt which was kept at the molten state for a varied length of time of 5, 10, 15 or 20 hours before it was again seeded with the seed crystal and crystal growing was started to grow a single crystal boule of 55 mm diameter and 150 mm length.

Each of the thus grown single crystal boules was sliced and the number of the particulate inclusions was counted as mentioned above to give the results in pieces/cm$^3$ as shown in FIG. 1 by the curve A. As is understood from this figure, the number of the particulate inclusions decreased as the settling time was extended but the best results were obtained when this time was 15 hours or longer.

Similarly to the above, runs of crystal growing were undertaken each with 236.3 g of gadolinium oxide and 203.7 g of gallium oxide by use of an iridium crucible of 50 mm inner diameter and 50 mm depth to obtain a single crystal boule of gadolinium gallium garnet having a diameter of 25 mm and a length of 70 mm. The number of particulate inclusions was counted in the same manner as above for the single crystal boules grown by keeping the oxide melt for 5, 10, 15 and 20 hours before crystal growing was started. The results are shown in FIG. 1 by the curve B. As is understood from comparison of this curve with the curve A, the effect of the extended settling time was less significant in these runs using a smaller crucible than in the runs by use of a larger crucible.

EXAMPLE 2.

The experimental procedure was substantially the same as in Example 1 above except that the oxide mixture charged into the crucible was composed of 6982 g of gadolinium oxide and 6018 g of gallium oxide and the iridium crucible had an inner diameter of 146 mm and a depth of 148 mm. The single crystal boule of gadolinium gallium garnet grown in this example had a diameter of 82 mm and a length of 220 mm. The number of particulate inclusions was counted in the same manner as in Example 1 for the single crystal boules grown by keeping the oxide melt at the molten state for 5, 10, 15 and 20 hours before crystal growing was started. The results are shown in FIG. 1 by the curve C. As is understood from this curve, a settling time of 15 hours or longer can give a satisfactory results in respect of the number of the inclusions in these experiments using a still larger crucible than in Example 1.

EXAMPLE 3.

Figure 2:
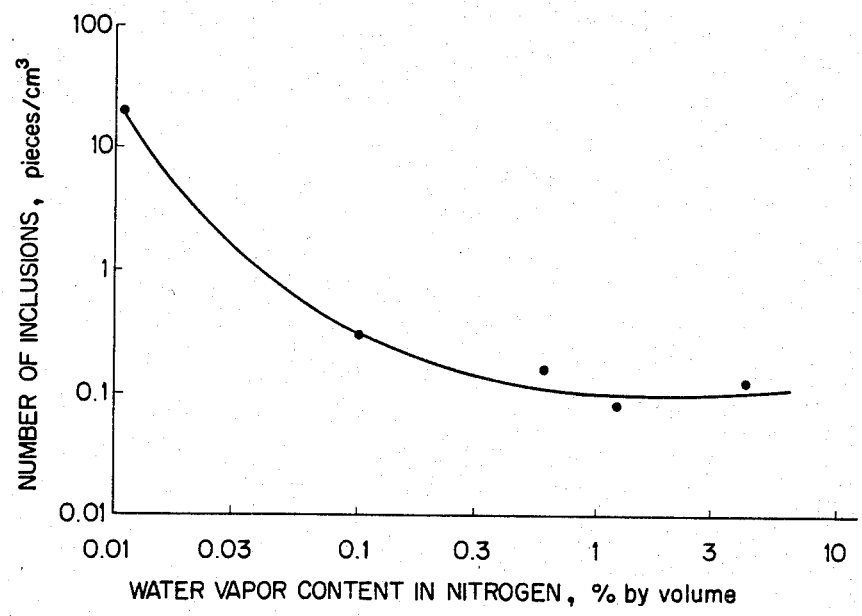
FIGS. 2 to 4 are each a graph showing the relationship between the content of the additive gases of water vapor, carbon dioxide and oxygen, respectively, to the nitrogen atmosphere and the number of the inclusions in the single crystal boules grown in the respective atmospheres.

The experimental procedure was substantially the same as in the experiments in Example 1 using a crucible of 96 mm inner diameter and 98 mm depth except that the moisture content of the atmospheric nitrogen gas was modified. The settling time of keeing the oxide melt in the molten state was always 15 hours. The moisture content of the atmospheric nitrogen gas was controlled at 0.01, 0.1, 1.2 and 4.2% by volume corresponding to a dew point of −40°, −20°, +10° or +30° C., respectively. The number of the particulate inclusions was counted in the same manner as in Example 1 for these single crystal boules to give the results plotted in FIG. 2 as a function of the moisture content in the atmospheric gas including one of the data plotted in FIG. 1, curve A. The results in this figure indicates that the moisture content in the atmospheric gas should be at least 0.1% by volume in order to obtain substantial improvement in respect of the number of inclusions while no further additional improvement can be obtained by increasing the moisture content over 4.0% by volume.

EXAMPLE 4.

Figure 3:
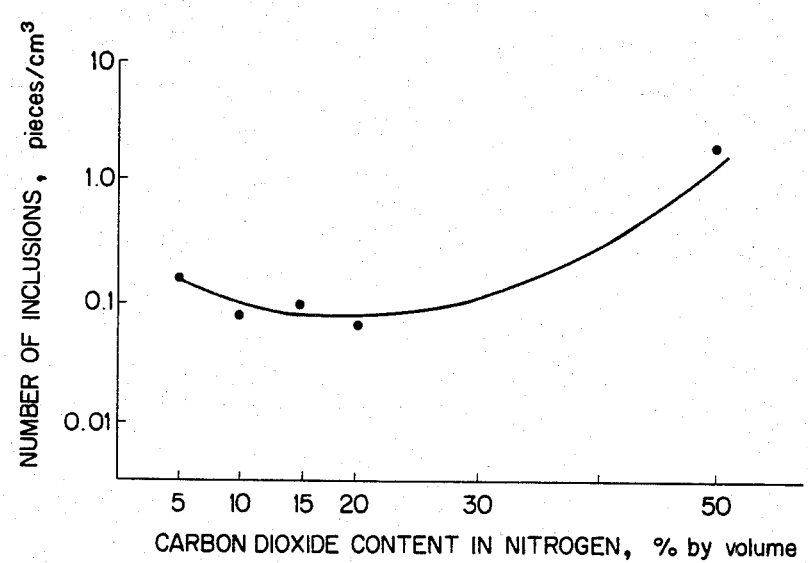

The experimental procedure was substantially the same as in the experiments in Example 1 using the crucible of 96 mm inner diameter and 98 mm depth excepting the composition of the atmospheric gas which was a binary mixture composed of high purity nitrogen gas having a dew point of −70° C. or below and carbon dioxide gas of 99.99% purity. The content of carbon dioxide in the atmospheric gas was controlled to 5, 10, 15, 20 or 50% by volume. The oxide melt formed in the crucible was kept for 15 hours before the start of crystal growing. The number of the particulate inclusions in the thus grown single crystal boules was counted in the same manner as in Example 1 to give the results shown in FIG. 3 as a function of the content of carbon dioxide in the atmospheric gas. As is understood from this figure, best results were obtained when the content of carbon dioxide in the atmospheric gas was in the range from 10 to 20% by volume.

EXAMPLE 5.

Figure 4:
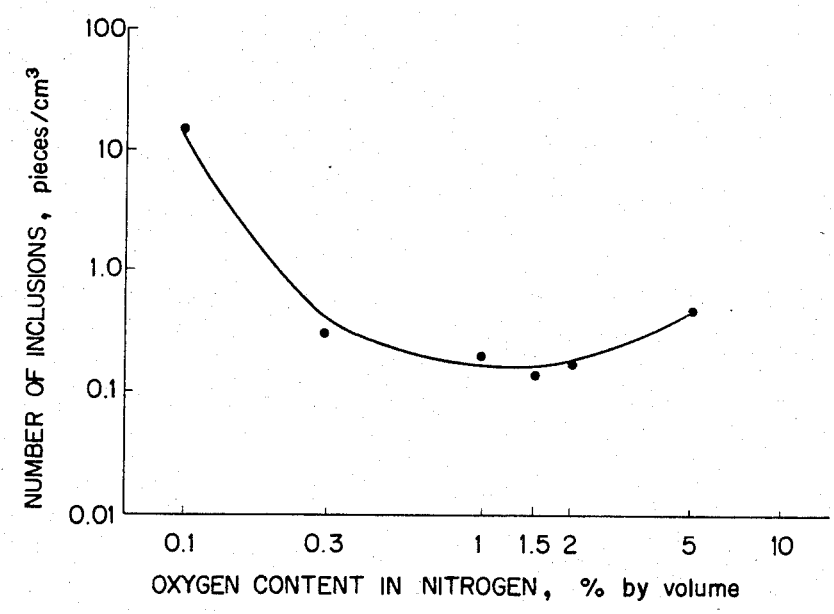

The experimental procedure was substantially the same as in the experiments in Example 1 using the crucible of 96 mm inner diameter and 98 mm depth excepting the kind and amount of the additive gas to the atmospheric nitrogen gas of 99.997% purity. The additive gas in this example was oxygen gas of 99.99% purity and the content of the oxygen gas in the atmospheric gas was controlled to 0.1, 0.3, 1.0, 1.5, 2.0, 3.0 or 5.0% by volume. The oxide melt in the crucible was kept for 15 hours in the molten state before the start of crystal growing. The number of the particulate inclusions in the thus grown single crystal boules was counted in the same manner as in Example 1 to give the results shown in FIG. 4 by plotting the data as a function of the oxygen content in the atmospheric gas. As is understood from this figure, substantial improvement of decreasing the number of inclusions was obtained when the oxygen content in the atmospheric gas was 0.3% by volume or larger while increase of the oxygen content to 2.0% by volume or larger was undesirable due to the adhesion of a foreign material around the periphery of the single crystal under growing to start dislocations in the crystal structure therefrom.

EXAMPLE 6.

An approximately 3:5 by moles mixture of neodymium oxide and gallium oxide was prepared by mixing 2074 g of the former having a nominal purity of 99.995% and 1926 g of the latter also having a nominal purity of 99.995% and the oxide mixture was shaped and sintered at 1450° C. for 5 hours into sintered blocks. These sintered blocks were put into an iridium crucible of 96 mm inner diameter and 98 mm depth and melted by heating to about 1570° C. with high frequency induction under an atmosphere of nitrogen gas of 99.997% purity containing 0.6% by volume of water vapor. When the oxide mixture had been melted in the crucible, the high frequency power input was controlled to keep the temperature of the melt approximately constant and the oxide melt was kept as such for 15 hours in the molten state. Thereafter, single crystal growing was started with a seed crystal of neodymium gallium garnet having a crystal orientation of <111> in about the same manner as in the preceding examples to give a single crystal boule of neodymium gallium garnet having a diameter of 55 mm and a length of 150 mm in the cylindrical portion. This single crystal boule was sliced and examined for the number of particulate inclusions in the same manner as in Example 1 to find absolutely no inclusions therein.

What is claimed is:

1. In the method for the preparation of a single crystal boule of a rare earth-gallium garnet by the Czochralski crystal growing procedure comprising melting a mixture of a rare earth oxide and gallium oxide to form an oxide melt in an iridium crucible, contacting a seed crystal of the rare earth-gallium garnet to the surface of the oxide melt and pulling up the seed crystal to start growing of the single crystal on the seed crystal under a gaseous atmosphere, wherein the improvement comprises keeping the oxide melt formed in the crucible in the molten state for at least 15 hours before the oxide melt is contacted with the seed crystal to start growing of a single crystal, contacting the seed crystal with the oxide melt to start the growing and growing the garnet to a diameter of at least 50 mm in an iridium crucible having an inner diameter of at least 80 mm.

2. The improvement as described in claim 1 wherein the gaseous atmosphere contains from 0.1 to 4.0% by volume of water vapor.

3. The improvement as described in claim 1 wherein the gaseous atmosphere contains from 10 to 20% by volume of carbon dioxide.

4. The improvement as described in claim 1 wherein the gaseous atmosphere contains from 0.3 to 1.5% by volume of oxygen.

* * * * *